US010164653B1

(12) United States Patent
Kinyua

(10) Patent No.: US 10,164,653 B1
(45) Date of Patent: Dec. 25, 2018

(54) ANALOG TO DIGITAL CONVERTER

(71) Applicant: Taiwan Semiconductor Manufacturing Company, Ltd., Hsinchu (TW)

(72) Inventor: Martin Kinyua, Cedar Park, TX (US)

(73) Assignee: Taiwan Semiconductor Manufacturing Company, LTD. (TW)

( * ) Notice: Subject to any disclaimer, the term of this patent is extended or adjusted under 35 U.S.C. 154(b) by 0 days.

(21) Appl. No.: 15/685,198

(22) Filed: Aug. 24, 2017

(51) Int. Cl.
*H03M 1/38* (2006.01)
*H03M 1/50* (2006.01)
*H03M 3/00* (2006.01)
*H03M 1/36* (2006.01)
*H03M 1/10* (2006.01)
*H03M 1/12* (2006.01)

(52) U.S. Cl.
CPC ........... *H03M 1/50* (2013.01); *H03M 1/1042* (2013.01); *H03M 1/1205* (2013.01); *H03M 1/362* (2013.01); *H03M 1/38* (2013.01); *H03M 3/442* (2013.01)

(58) Field of Classification Search
CPC ........ H03M 1/56; H03M 1/468; H03M 1/145; H03M 1/1023; H03M 1/1245; H03M 1/38; H03M 1/002; H03M 1/44
USPC ........................................ 341/155, 161, 162
See application file for complete search history.

(56) References Cited

U.S. PATENT DOCUMENTS

| | | | | |
|---|---|---|---|---|
| 8,531,323 | B2 * | 9/2013 | Li | H03M 1/0695 341/118 |
| 9,606,511 | B2 * | 3/2017 | Kurose | G04F 10/005 |
| 2011/0001647 | A1 * | 1/2011 | Veeder | H03M 1/164 341/146 |
| 2013/0187802 | A1 * | 7/2013 | de Figueiredo | H03M 1/1009 341/118 |
| 2013/0208915 | A1 * | 8/2013 | Hammerschmidt | H04R 3/00 381/98 |
| 2016/0072518 | A1 * | 3/2016 | Francis | H03M 1/468 341/122 |
| 2016/0211858 | A1 * | 7/2016 | Kinyua | H03M 1/145 |
| 2016/0359463 | A1 * | 12/2016 | Kurose | H03M 1/50 |

* cited by examiner

*Primary Examiner* — Linh Nguyen
(74) *Attorney, Agent, or Firm* — Merchant & Gould P.C.

(57) ABSTRACT

An analog-to-digital converter ("ADC") includes receiving an analog input voltage signal, converting the analog input voltage signal to a first digital value and an analog residue signal, converting the analog residue signal to a time value representing the analog residue signal, and converting the time value to a second digital value. The first digital value and the second digital value are combined into a digital output signal representing the analog input voltage signal.

16 Claims, 9 Drawing Sheets

Control Logic
530
$V_{IN}$
$V_{REFP}$
$V_{REFM}$
$\phi_{DAC,N}$
$\phi_{TH}$
521
$\phi_{DAC,1}$
$\phi_{DAC,2}$
523
524
$\phi_{DAC,N}$
511
512
522
513
514
C
C/2
C/4
$C/2^N$
Vres
516
430
$\phi_{TH}$
gnd
542
$C_{OS}$
$\phi_{BIT}$
$\phi_{TH}$
gnd
$\phi_{DAC,N}$
$V_{OS}$
540
AVDD
$I_{DIS}$
$\phi_{DIS}$
332
gnd
$\phi_{CM}$
$\phi_A$
330
$A_{OL}$
334
ZCD
$T_P$
gnd
20

ANALOG TO DIGITAL CONVERTER

BACKGROUND

Analog-to-digital converters ("ADC") are used in a variety of applications in order to convert a detected analog signal into a digital signal. Typically, the digital output is a binary number that is proportional to the input. The continuous analog input signal is periodically sampled, and the output is a discrete digital signal. Converting a continuous analog signal to a digital signal requires quantization of the analog input, which can introduce error.

Factors measuring ADC performance include conversion bandwidth and dynamic range (signal-noise-ratio), among other things. The bandwidth of an ADC is characterized primarily by its sampling rate, and the dynamic range of an ADC is influenced by factors such as resolution (number of discrete values output over the range of the analog input values), linearity and accuracy (how well the quantization levels match the true analog signal), etc. The dynamic range of an ADC may be expressed in terms of its effective number of bits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
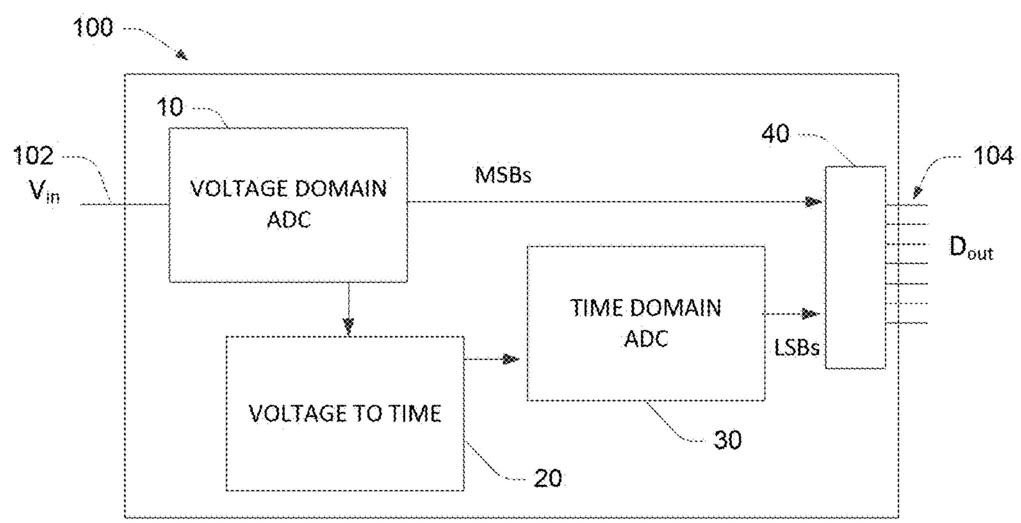
FIG. 1 is a block diagram illustrating aspects of an analog-to-digital converter ("ADC") system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Analog-to-digital converters ("ADC") convert an analog signal into a digital signal. Typical ADC arrangements include as pipelined, flash, Delta-Sigma, integrating (sloping), successive approximation register ("SAR"), etc. Pros and cons are associated with each ADC architecture. For instance, Delta-Sigma ADCs are capable of achieving relatively high resolution (16 bits and higher), but the achievable bandwidth may be limited. SAR ADCs are able to operate with relatively low power consumption, but may have limited resolution.

FIG. 1 is a block diagram illustrating an example ADC in accordance with aspects of the present disclosure. The ADC 100 shown in FIG. 1 includes an input terminal 102 that receives an analog input voltage signal Vin. An output terminal 104 provides a digital representation Dout of the analog input signal. A first stage 10 is coupled to the input terminal 102 and converts the received analog input voltage signal to a first digital value and an analog residue signal. A second stage 20 is coupled to the first stage 10 and converts the analog residue signal to a time value representing the analog residue signal. A third stage 30 is coupled to the second stage and converts the time value to a second digital value, and a controller 40 combines the first digital value and the second digital value into the digital output signal representing the analog input voltage signal provided at the output terminal 104.

In some examples the first stage 10 converts the analog input signal in the voltage domain, and provides a predetermined number N1 of bits out of a total of M output bits (N1 and M are positive integers). In the illustrated example, the N1 bits are the most significant bits ("MSBs") of the M output bits. In such examples, the third stage converts the analog residue signal in the time domain, and outputs a predetermined number N2 of bits out of the M output bits (N2 is a positive integer). For example, the N2 bits are the least significant bits ("LSBs") of the M output bits.

Figure 2:
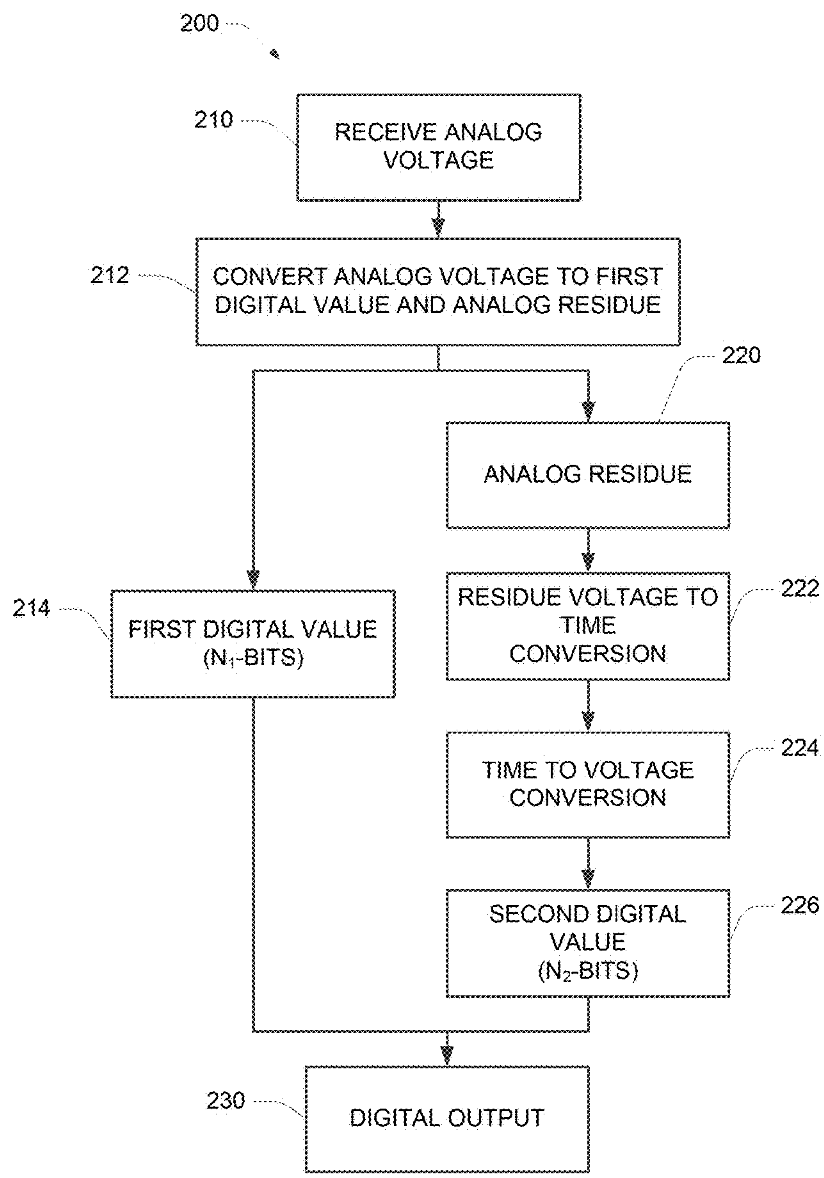
FIG. 2 a process flow diagram illustrating an example of an ADC method in accordance with some embodiments

FIG. 2 is a flow diagram illustrating an ADC method 200 in accordance with disclosed examples. In FIG. 2, an analog input voltage signal is received at an operation 210. The analog input voltage signal is converted a first digital value and an analog residue signal at operation 212. In some implementations, the analog input voltage signal is converted to the first digital value in the voltage domain, and in the example shown in FIG. 2, the N1 bits of the digital output are converted in the voltage domain as shown in operations 212 and 214.

Operation 212 further outputs an analog residue signal as shown in operation 220, which is converted to a time value representing the analog residue signal in operation 222, and the time value is converted to a second digital value in the time domain in operation 224, outputting the N2 bits of the digital output as shown in operation 226. In operation 230, the first digital value and the second digital value into a digital output signal (for example, M output bits) representing the analog input voltage signal.

Figure 3:
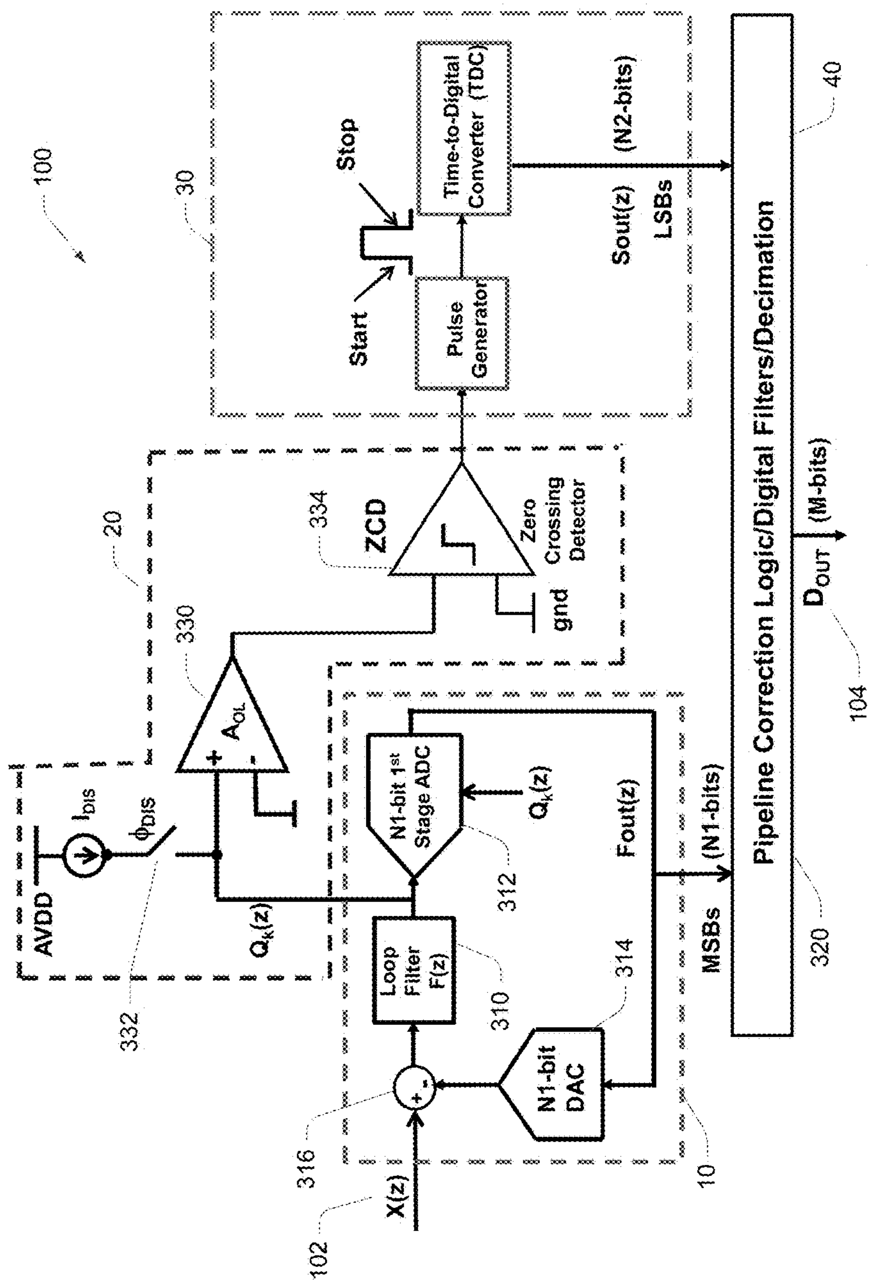
FIG. 3 is a circuit diagram illustrating further aspects of an example ADC system in accordance with some embodiments.

FIG. 3 is a block diagram illustrating further aspects of the ADC 100 in accordance with disclosed examples. In the embodiment shown in FIG. 3, the first stage 10 includes delta-sigma, successive approximation register ("SAR") ADC arrangement that outputs the N1 MSBs of the digital output Dout. The first stage ADC 10 thus receives the analog input signal Vin (indicated as X(z) in FIG. 3) at the input terminal 102, which is filtered by a loop filter 310, and converted to a digital output Fout(z) by a SAR ADC 312. The SAR ADC output Fout(z) comprises the N1 digital bits of the M digital output bits, which are provided to an output stage 320 implemented by the controller 40. The output Fout(z) of the SAR ADC 312 is also received by a digital-to-analog converter ("DAC") 314 which converts the N1 bits back to an analog value that is received at a summation point 316 and compared to the original analog input signal X(z). The analog residue, or quantization error signal $Q_k(z)$, is output to the second stage 20, which is a voltage-to-time converter ("VTC") in the example shown in FIG. 3.

Figure 4:
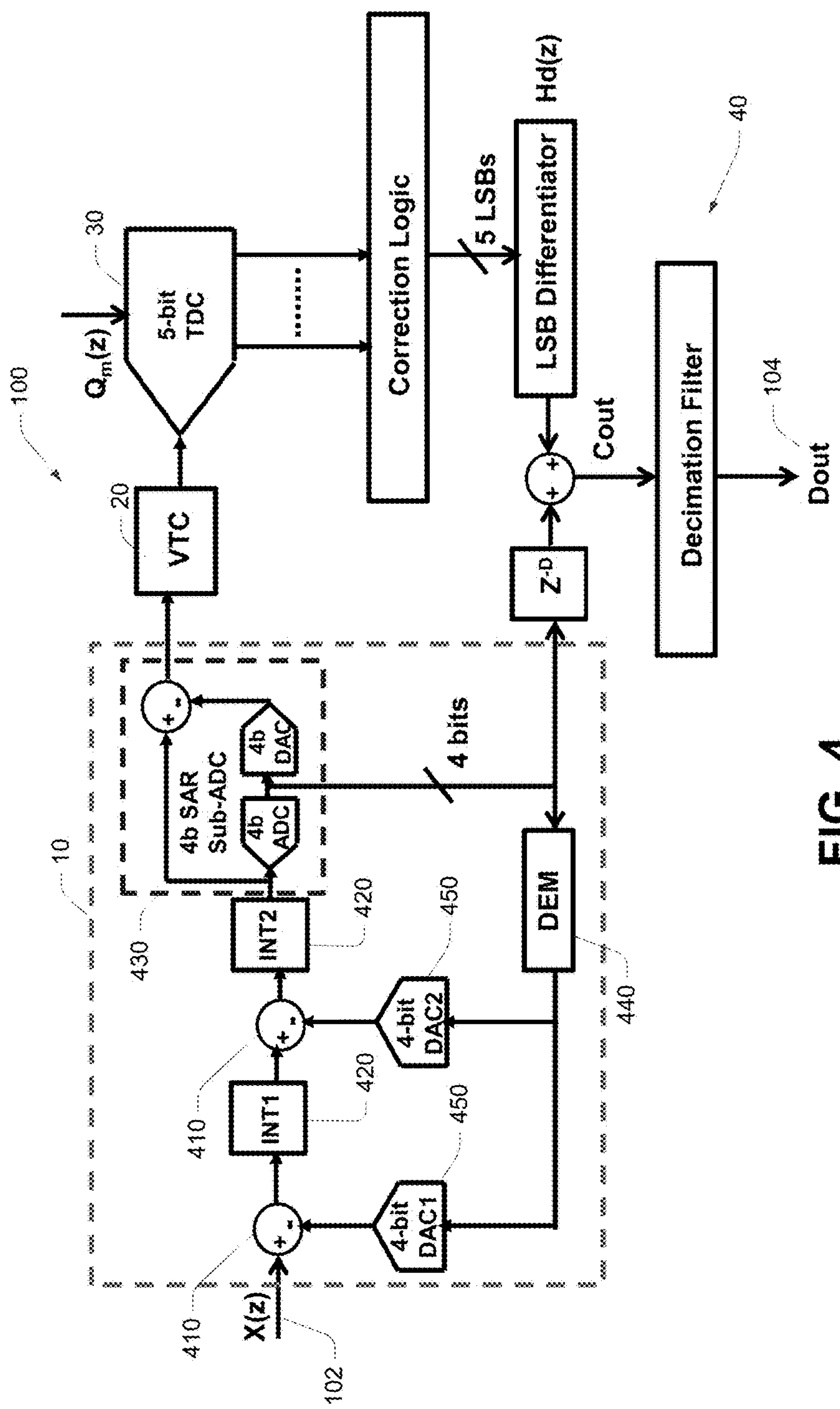
FIG. 4 is a circuit diagram illustrating aspects of an example first stage ADC in accordance with some embodiments.

FIG. 4 illustrates further aspects of an example of the SAR based ADC of the first stage 10 shown in FIG. 3. The SAR based ADC 10 shown in FIG. 4 comprises a second order Delta-Sigma ADC, which includes summation points 410 providing respective outputs to a corresponding integrator 420. The output of the integrator 420 is converted to a digital value by a four-bit SAR sub-ADC 430 (N1=4 bits), which are output to the output stage 320 shown in FIG. 3. The first stage ADC 10 shown in FIG. 4 further includes dynamic element matching 440 which also receives the N1 output bits, which are converted to analog values by DACs 450, the outputs of which are provided to the summation points 410. The SAR ADC 430 additionally outputs the residue signal $Q_k(z)$ to the VTC second stage 20.

Figure 5:
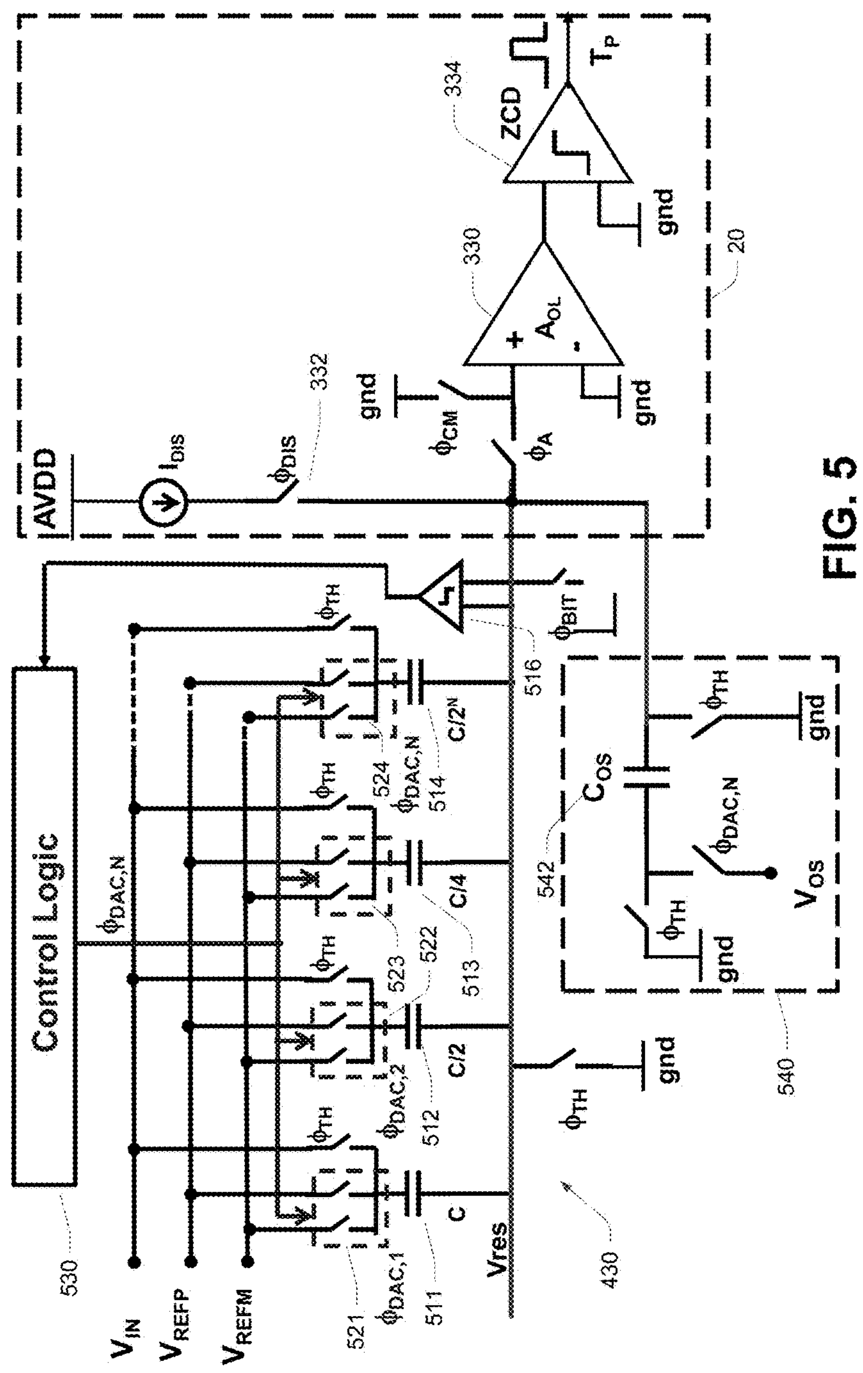
FIG. 5 is a circuit diagram illustrating further aspects of an example first stage ADC in accordance with some embodiments.

FIG. 5 illustrates an example of the SAR ADC 430, which receives the input voltage Vin, along with reference voltages $V_{Ref}P$ and $V_{Ref}M$. The SAR ADC 430 includes an internal circuit that tracks and holds the input voltage signal Vin. The internal circuit includes four capacitors 511-514, which correspond to each of the N1 output bits. Switching devices 521-524 couple the input and reference voltages Vin, $V_{Ref}P$, $V_{Ref}M$ to the capacitors 511-514 in response to a SAR switch controller 530. A residue offset circuit 540 further includes an offset capacitor 542. Each of the SAR capacitors 511-514 and the offset capacitor 542 together hold and output the residue voltage Vres, or quantization error $Q_k(z)$. The residue voltage Vres is received as an input by a comparator 516, and also output to the VTC second stage 20.

The VTC second stage 20 includes an amplifier 330 to which the residue voltage Vres/quantization error $Q_k(z)$ is coupled. As discussed further below, a switching device 332 selectively connects the quantization error $Q_k(z)$ to a constant discharge current $I_{DIS}$ so as to selectively discharge the quantization error $Q_k(z)$. The discharging quantization error signal $Q_k(z)$ is amplified by the amplifier 330, and the amplified signal is received by a zero crossing detector ("ZCD") 334.

Figure 6:
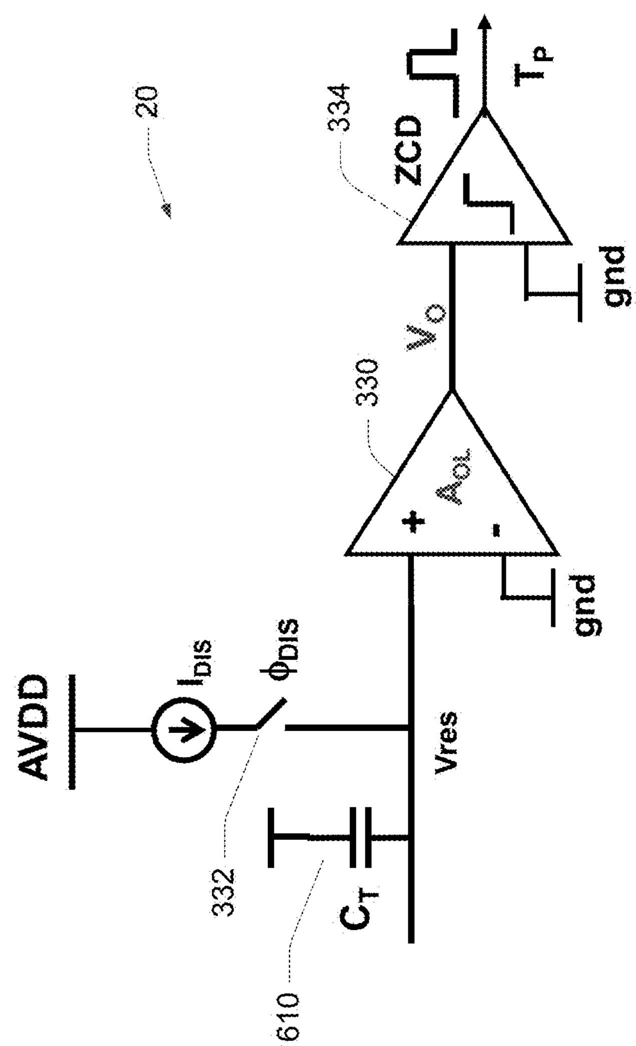
FIG. 6 is a circuit diagram illustrating aspects of an example voltage-to-time converter in accordance with some embodiments.

FIG. 6 illustrates an embodiment of the VTC second stage 20. A capacitor 610 charges according to the level of the residue voltage output by the first stage 10. In other words, the capacitor 610 charges to the residue voltage level. The switching device 332 connects the capacitor 610 to the constant discharge current $I_{DIS}$ to discharge the capacitor 610, thus inputting the residue voltage Vres to the input of the amplifier 330. The output of the amplifier 330 is received by the ZCD 334 to provide a time domain representation of the residue voltage Vres. In the illustrated embodiment, the ZCD 334 outputs a pulse $T_P$ having a pulse width in accordance with the residue voltage level.

As noted above, the first stage ADC 10 converts a first portion of the analog input signal Vin to a first digital signal—the N1 MSBs of the digital output. The remaining portion of the analog input signal, is the residue signal Vres, is thus the analog input voltage Vin less the first stage DAC voltage as defined according to equation [1] below.

$$V_{RES}=V_{IN}-V_{DAC} \quad [1]$$

The output of the amplifier is the amplified residue voltage, Vo, which is the residue voltage Vres plus the amplifier offset voltage Vos, less the load discharge based on the capacitor 610 and the discharge current IDIS, multiplied by the amplifier gain AOL as shown in Equation [2]

$$V_O = \left\lfloor (V_{IN} - V_{DAC}) + V_{OS} - \frac{I_{DIS}T_{DIS}}{C_T} \right\rfloor \cdot A_{OL} \quad [2]$$

At zero crossing of equation [2], the discharge time $T_{DIS}$ is as shown in Equation [3]

$$T_{DIS} = (V_{IN} - V_{DAC} + V_{OS}) \cdot \frac{C_T}{I_{DIS}} \quad [3]$$

Thus, the amplifier gain $A_{OL}$ may be removed from the capacitor discharge time $T_{DIS}$ equation. Therefore, with the illustrated arrangement, the discharge time $T_{DIS}$ is linear regardless of the characteristics of the open loop amplifier. This allows use of a simple open loop amplifier, and does not require a feedback loop as in typical VTC arrangements, where high gain, higher power consumption, closed loop amplifiers are required.

Figure 7:
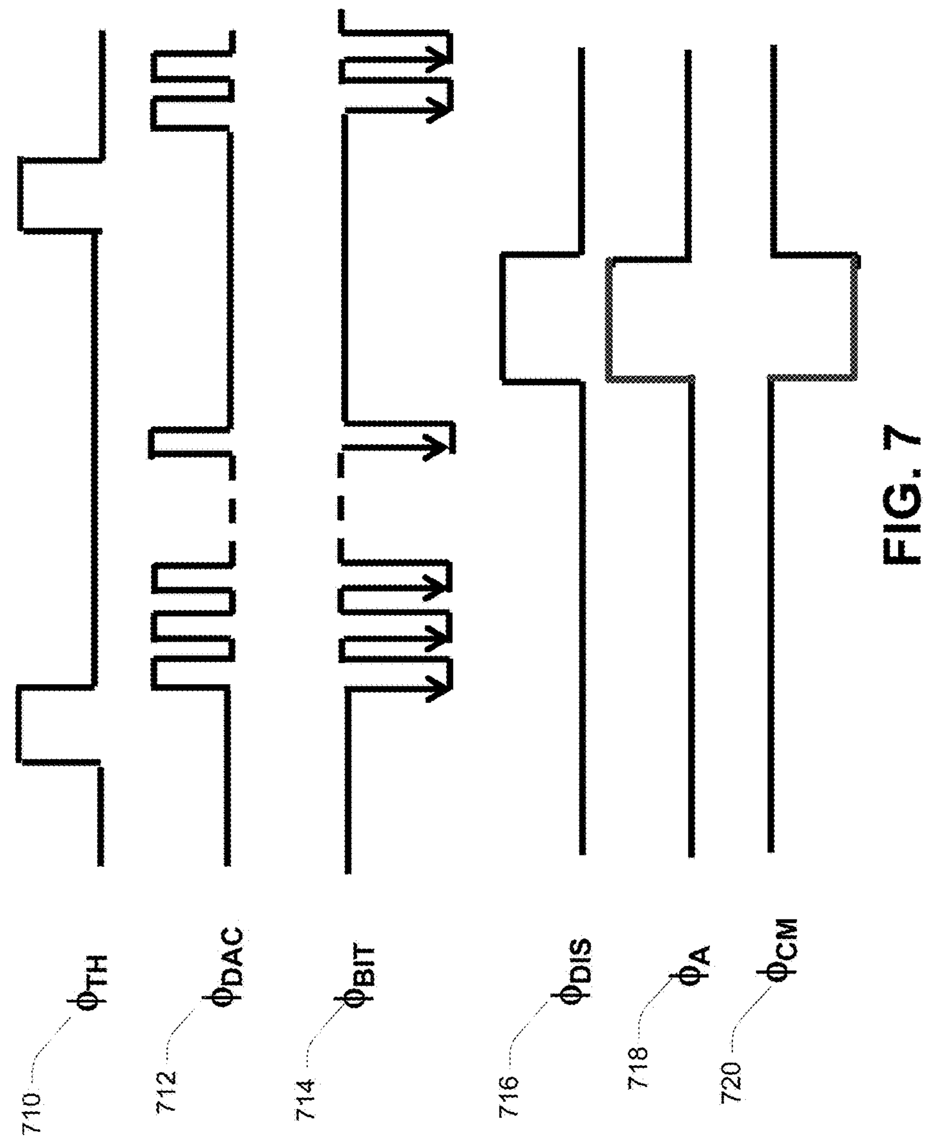
FIG. 7 is a timing diagram illustrating an example timing sequence for an example first stage ADC and an example residue voltage to time conversion in accordance with some embodiments.

FIG. 7 illustrates an example timing diagram for the first stage 10 SAR ADC 430 and the VTC second stage 20. FIG. 7 illustrates the first phase $\phi_{TH}$ pulse 710 corresponding to a track and hold function. The first stage ADC 10 bit cycling 712 and digital bit decision pulses 714, residue voltage discharge 716, residue amplifier 718 and amplifier reset 720 signals are further shown in FIG. 7.

The timing diagram signals are generated in the control logic 530 shown in FIG. 5. FIG. 7 illustrates the first phase $\phi_{TH}$ pulse 710 corresponding to a track and hold function. When the $\phi_{TH}$ pulse 710 is high, the signal Vin in FIG. 5 is acquired on the top plates of the capacitors 511-514. During the next phase, the $\phi_{DAC}$ pulse 712 is asserted and controls a typical successive approximation register (SAR) binary search algorithm. The third phase $\phi_{BIT}$ 714 enables the comparator 516 operation in order to generate the digital bits in tandem with the SAR operation. The generated digital bits are latched in the control logic block 530. During the fourth phase, the $\phi_{DIS}$ 716 signal goes high and turns on the discharging current switch 332. During this phase, the residue voltage Vres stored on the bottom plates of the capacitors 511-514 is discharging. At the same time, the pulse $\phi_A$ 718 couples the discharging current to the non-inverting terminal of the amplifier 330. Also, when the discharging current switch 332 is ON, the pulse signal $\phi_{DIS}$ 720 is low, which decouples the non-inverting input of the amplifier 330 from the ground node gnd. When the amplifier 330 detects that the reside voltage Vres has been discharged to zero, its output signal enables the ZCD 334 to generate the pulse $T_p$, which is a time representation of the original residue voltage Vres stored on the bottom plates of the of the capacitors 511-514.

Figure 8:
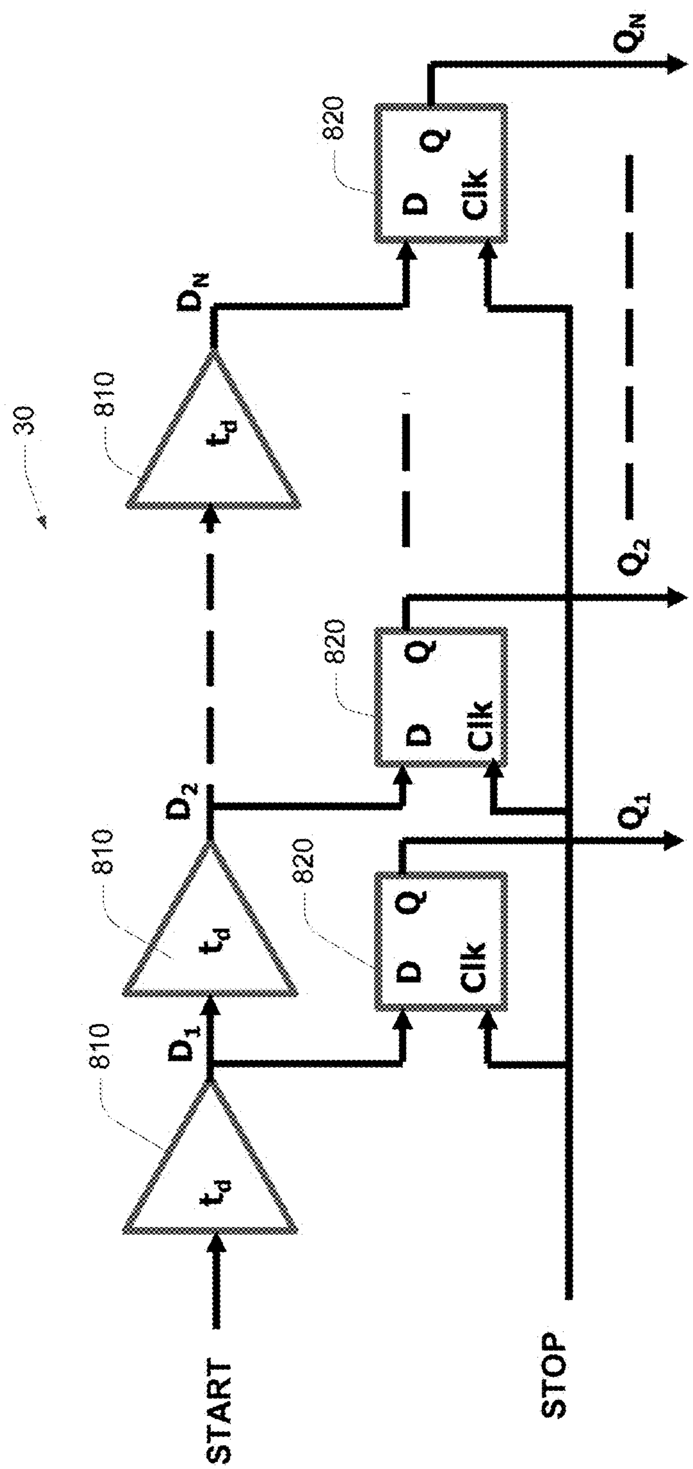
FIG. 8 is a circuit diagram illustrating aspects of an example time-to-digital converter in accordance with some embodiments.

FIG. 8 illustrates an example of the third stage 30, which includes a time-to-digital converter ("TDC") configured to convert the output of the VTC 20 to a digital value representing the residue voltage. The example shown in FIG. 8 uses a digital delay line unit element to measure the time interval of the pulse output by the VTC 20. A START signal (rising edge of the output pulse $T_P$ from the VTC 20) received by a series of delay line unit elements 810, which are implemented as voltage controlled delay cells in some embodiments. The output of each line delay unit element 810 are also received by a plurality of flip-flops 820 arranged as a shift register. In response to a STOP signal (falling edge of the output pulse $T_P$ from the VTC 20) latches the status of the delay line, providing the digital representation of the analog residue signal. A delay locked loop (DLL) further included in some examples to stabilize the unit delay against process, power supply and temperature variations.

Figure 9:
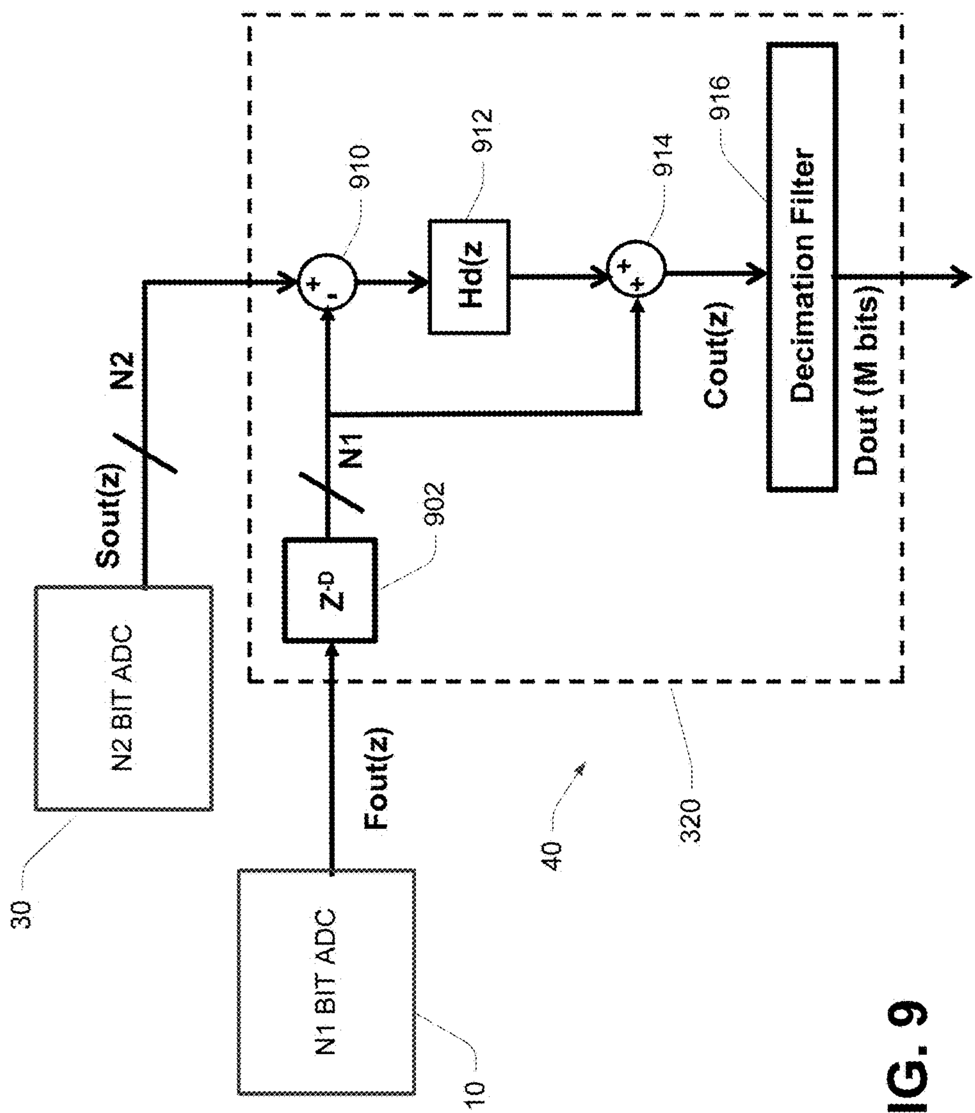
FIG. 9 is a circuit diagram illustrating aspects of an example digital output stage in accordance with some embodiments.

As noted above, the digital representation of the analog residue signal comprises the N2 bits (LSBs) of the ADC output. The output stage 320 shown in FIG. 3 is configured to combine the N1 and N2 bits to provide the final M bit digital output. FIG. 9 shows an example of the output stage 320, which includes pipeline correction logic, digital filters, and decimation functions. The output stage 320 (and other controller devices mentioned herein) may be implemented by any suitable control device, such as a microprocessor, microcontroller, application specific integrated circuit (ASIC), programmable logic device, etc.

The N1 and N2 bits output by the first and third stages 10, 30, respectively, are received at a first summation point 910. In the illustrated example, the N1 output bits are first received by a delay unit 902 to delay the N1 output bits so as to align with the N2 output bits. The output of the first summation point 910 is received by a differentiator 912, the output of which is summed to the N1 bits at a second summation point 914. The combined output Cout(z) is received by a decimation filter 916, which provides the M bit digital output Dout, representing the analog input voltage Vin.

The output of the first stage 10, Fout(z), is based on the signal transfer function STF(z) and the noise transfer function NTF(z) as shown in Equation [4] below.

$$F_{out}(z)=\mathrm{STF}(z)X(z)+\mathrm{NTF}(z)Q_k(z) \quad [4]$$

The output of the TDC third stage 30 Sout(z) and the combined output Cout(z) are according to Equations [5] and [6].

$$S_{out}(z)=z^{-D}[F_{out}(z)-Q_k(z)]+Q_M(z) \quad [5]$$

$$C_{out}(z)=z^{-D}F_{out}(z)+H_d(z)[S_{out}(z)-z^{-D}F_{OUT}(z)] \quad [6]$$

Substituting Equations [4] and [5] into Equation [6] results in Equation [7].

$$C_{out}(z)=z^{-D}\mathrm{STF}(z)X(z)+z^{-D}[\mathrm{NTF}(z)-H_d(z)]Q_k(z)H_d(z)Q_m(z) \quad [7]$$

If the digital filter function Hd(z) in Equation [7] (filter Hd(z) 912 in FIG. 9) is identical to the NTF(z), then Cout(z) is as shown in Equation [8].

$$C_{out}(z)=z^{-D}\mathrm{STF}(z)X(z)+\mathrm{NTF}(z)Q_m(z) \quad [8]$$

Accordingly, the various embodiments disclosed herein provide an ADC method and system that can simultaneously attain a high dynamic range and a large conversion bandwidth. Examples of the ADC employs a combination of a voltage domain ADC, such as a Delta-Sigma ADC loop together with a SAR quantizer for low power and high resolution, with a time domain ADC having a voltage-to-time converter coupled to a time-to-digital cascaded stage. The disclosed examples are capable of scalability benefits in deep sub-micron process technology with good power efficiency.

Disclosed embodiments include an ADC that includes an input terminal configured to receive an analog input voltage signal, with a first stage coupled to the input terminal and configured convert an analog input voltage signal received at the input terminal to a first digital value and an analog residue signal. A second stage is coupled to the first stage and is configured to convert the analog residue signal to a time value representing the analog residue signal. A third stage is coupled to the second stage and is configured to convert the time value to a second digital value. A controller is coupled to the first and third stages and configured to combine the first digital value and the second digital value into a digital output signal representing the analog input voltage signal.

In accordance with further disclosed embodiments, an analog-to-digital conversion method includes receiving an analog input voltage signal, and converting the analog input voltage signal to a first digital value and an analog residue signal. The analog residue signal is converted to a time value representing the analog residue signal, and the time value is converted to a second digital value. The first digital value and the second digital value are combined into a digital output signal representing the analog input voltage signal.

In accordance with still further disclosed embodiments, an ADC includes an input terminal and a controller coupled to the input terminal. The controller is configured to convert an analog input voltage signal received at the input terminal to a first digital value and an analog residue signal, convert the analog residue signal to a time value representing the analog residue signal, convert the time value to a second digital value, and combine the first digital value and the second digital value into a digital output signal representing the analog input voltage signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An analog-to-digital converter ("ADC"), comprising:

an input terminal configured to receive an analog input voltage signal;

a first stage coupled to the input terminal and configured to convert an analog input voltage signal received at the input terminal to a first digital value and an analog residue signal;

a second stage coupled to the first stage and configured to convert the analog residue signal to a time value representing the analog residue signal, wherein the second stage comprises a voltage-to-time stage including a capacitive device configured to selectively charge based on the analog residue signal, and an open loop amplifier having an input terminal receiving an output of the capacitive device;

a third stage coupled to the second stage and configured to convert the time value to a second digital value; and a controller coupled to the first and third stages and configured to combine the first digital value and the second digital value into a digital output signal representing the analog input voltage signal.

2. The ADC of claim 1, wherein the voltage-to-time stage further includes a zero crossing detector receiving an output of the open loop amplifier.

3. The ADC of claim 1, wherein the third stage is configured to generate a pulse in response to the zero crossing detector to provide a time domain representation of the analog residue signal.

4. The ADC of claim 1, wherein the open loop amplifier does not include a feedback loop.

5. The ADC of claim 4, wherein the voltage-to-time stage further includes a switching device configured to selectively couple the analog residue signal to a constant current source.

6. The ADC of claim 1, wherein the first stage is configured convert the analog input voltage signal to the first digital value in the voltage domain.

7. The ADC of claim 4, wherein the first stage includes a successive approximation register ("SAR") ADC.

8. The ADC of claim 1, wherein the controller is configured to delay an output of the first digital value.

9. An analog-to-digital conversion ("ADC") method, comprising:

receiving an analog input voltage signal;

converting the analog input voltage signal to a first digital value and an analog residue signal;

sampling the analog residue signal with a capacitive device configured to selectively charge based on the analog residue signal;

amplifying the sampled analog residue signal using an open loop amplifier;

converting the amplified analog residue signal to a time value representing the analog residue signal;

converting the time value to a second digital value; and combining the first digital value and the second digital value into a digital output signal representing the analog input voltage signal.

10. The method of claim 9, wherein the analog input voltage signal is converted to the first digital value in the voltage domain.

11. The method of claim 9, further comprising detecting a zero crossing of the analog residue signal.

12. The method of claim 9, wherein the first digital value comprises most significant bits of the digital output signal.

13. The method of claim 9, wherein the second digital value comprises least significant bits of the digital output signal.

14. An analog-to-digital converter ("ADC"), comprising:

an input terminal;

a voltage-to-time converter including a capacitive element and an open loop amplifier receiving an output of the capacitive element;

a controller coupled to the input terminal, the controller configured to:

convert an analog input voltage signal received at the input terminal to a first digital value and an analog residue signal;

sample the analog residue signal with the capacitive element;

convert the analog residue signal to a time value representing the analog residue signal, including amplifying the sampled residue signal with the open loop amplifier;

convert the time value to a second digital value; and combine the first digital value and the second digital value into a digital output signal representing the analog input voltage signal.

15. The ADC of claim 14, wherein the open loop amplifier is inherently linear.

16. The ADC of claim 14, wherein the voltage-to-time converter is configured to selectively couple the capacitive element to a constant current source to selectively discharge the capacitive element.

* * * * *